US012610580B2

(12) United States Patent
    Eikyu et al.

(10) Patent No.: US 12,610,580 B2
(45) Date of Patent: Apr. 21, 2026

(54) VERTICAL MOSFET SUPER JUNCTION DEVICE AND METHOD OF MANUFACTURING THE SAME

(71) Applicant: RENESAS ELECTRONICS CORPORATION, Tokyo (JP)

(72) Inventors: Katsumi Eikyu, Tokyo (JP); Yuta Nabuchi, Tokyo (JP); Atsushi Sakai, Tokyo (JP); Akihiro Shimomura, Tokyo (JP); Satoru Tokuda, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 634 days.

(21) Appl. No.: 17/886,049

(22) Filed: Aug. 11, 2022

(65) Prior Publication Data
    US 2023/0111142 A1     Apr. 13, 2023

(30) Foreign Application Priority Data

Oct. 12, 2021     (JP) ................................. 2021-167195

(51) Int. Cl.
    *H10D 30/66*         (2025.01)
    *H10D 30/01*         (2025.01)
                (Continued)

(52) U.S. Cl.
    CPC ....... *H10D 30/668* (2025.01); *H10D 30/0293* (2025.01); *H10D 30/0295* (2025.01);
                (Continued)

(58) Field of Classification Search
    CPC .. H10D 30/668; H10D 64/513; H10D 64/256; H10D 62/127; H10D 62/115; H10D 62/111; H10D 30/0291–0297
    See application file for complete search history.

(56) References Cited

U.S. PATENT DOCUMENTS

| | | | |
|---|---|---|---|
| 8,049,270 B2 | 11/2011 | Akiyama et al. | |
| 2020/0411683 A1* | 12/2020 | Kaya ..................... | H10D 62/111 |
| 2021/0217844 A1* | 7/2021 | Yanagigawa ........ | H10D 62/111 |

FOREIGN PATENT DOCUMENTS

| | | |
|---|---|---|
| JP | 2006-351713 A | 12/2006 |
| JP | 2008-108962 A | 5/2008 |
| JP | 2021-007129 A | 1/2021 |

OTHER PUBLICATIONS

Office Action dated Dec. 24, 2024, from corresponding Japanese Patent Application No. 2021-167195, 10 pages.

* cited by examiner

*Primary Examiner* — William B Partridge
*Assistant Examiner* — Chevy J Boegel
(74) *Attorney, Agent, or Firm* — Rimon P.C.

(57) ABSTRACT

A semiconductor device includes a plurality of unit cells. Each of the plurality of unit cells has a pair of column regions, a pair of trenches formed between the pair of column regions in the X direction, and a pair of gate electrodes formed in the pair of trenches via a gate insulating film, respectively. The two unit cells adjacent in the X direction share one column region of the pair of column regions and are arranged to be symmetrical about the shared column region. Here, a distance between the two trenches, which are adjacent with the one column region interposed therebetween, of the trenches in the two adjacent unit cells is different from a distance between the pair of trenches in the one unit cell.

10 Claims, 15 Drawing Sheets

B-B CROSS-SECTION

(51) Int. Cl.
    *H10D 62/10*         (2025.01)
    *H10D 64/27*         (2025.01)

(52) U.S. Cl.
    CPC ....... *H10D 30/0297* (2025.01); *H10D 62/127*
        (2025.01); *H10D 64/513* (2025.01); *H10D*
                              *62/115* (2025.01)

A–A CROSS–SECTION

*FIG. 4*
A–A CROSS-SECTION

A-A CROSS-SECTION

A–A CROSS-SECTION

A–A CROSS-SECTION

A–A CROSS–SECTION

A-A CROSS-SECTION

A–A CROSS–SECTION

A–A CROSS–SECTION

C—C CROSS-SECTION

B-B CROSS-SECTION

VERTICAL MOSFET SUPER JUNCTION DEVICE AND METHOD OF MANUFACTURING THE SAME

CROSS-REFERENCE TO RELATED APPLICATIONS

The disclosure of Japanese Patent Application No. 2021-167195 filed on Oct. 12, 2021 including the specification, drawings and abstract is incorporated herein by reference in its entirety.

BACKGROUND

The present invention relates to a semiconductor device and a method of manufacturing the same, in particular, a semiconductor device provided with a column region below a body region and a method of manufacturing the same.

As a structure for improving a withstand voltage in semiconductor elements such as a power MOSFET (Metal Oxide Semiconductor Field Effect Transistor) and the like, a PN junction structure referred to as the super junction structure (SJ structure) has been known. In the case of an n-type MOSFET, by two-dimensionally arranging a p-type column region in an n-type drift region, the periphery of the p-type column region is depleted, and the withstand voltage can be improved.

There are disclosed techniques listed below.
[Patent Document 1] Japanese Unexamined Patent Application Publication No. 2021-7129

For example, the multi-trench SJ structure in which a pair of trench gates are provided for one unit cell is suggested in Patent Document 1. In this multi-trench SJ structure, a plurality of column regions is formed at the boundaries of each unit cell at the same pitch. Also, the plurality of trench gates is also formed in each unit cell at the same pitch. In Patent Document 1, by providing no column region between a pair of trench gates, the normalized on-resistance (Rsp) is reduced while suppressing the increase in manufacturing variation.

SUMMARY

If further miniaturization is to be promoted in Patent Document 1, the dimensions of the unit cell are to be reduced without changing the existing structure. However, if each dimension is simply reduced, manufacturing variations will become more noticeable, and there is a fear that the influences of various types of ion implantation will cause the degradation in the performance of semiconductor device and the reliability of semiconductor device.

A main object of this application is to suppress these problems, namely, to provide a technology capable of suppressing the degradation in the performance of semiconductor device and ensuring the reliability of semiconductor device. Other problems and novel features will be apparent from the description of this specification and accompanying drawings.

The outline of the representative embodiment disclosed in this application will be briefly described as follows.

A semiconductor device according to an embodiment includes a plurality of unit cells. Each of the plurality of unit cells includes: a semiconductor substrate having a drift region made of a semiconductor layer of a first conductivity type; a body region of a second conductivity type opposite to the first conductivity type formed on a surface of the drift region; a source region of the first conductivity type formed on a surface of the body region; a pair of column regions of the second conductivity type which are formed in the drift region so as to be located below the body region and are separately adjacent to each other in a first direction in plan view; a pair of trenches formed in the drift region such that bottoms thereof reach a position deeper than the body region, and formed between the pair of column regions in the first direction; and a pair of gate electrodes formed in the pair of trenches via a gate insulating film, respectively. Here, the two unit cells adjacent in the first direction share one column region of the pair of column regions and are arranged to be symmetrical about the shared column region, and in the first direction, a distance between the two trenches, which are adjacent with the one column region interposed therebetween, of the trenches in the two adjacent unit cells is different from a distance between the pair of trenches in the one unit cell.

A method of manufacturing a semiconductor device including a plurality of unit cells according to an embodiment includes: (a) a step of preparing a semiconductor substrate having a drift region made of a semiconductor layer of a first conductivity type; (b) a step of forming a pair of trenches in the drift region; (c) a step of forming a pair of column regions of a second conductivity type opposite to the first conductivity type in the drift region so as to be separately adjacent to each other in a first direction in plan view; (d) a step of forming a pair of gate electrodes in the pair of trenches via a gate insulating film, respectively; (e) a step of forming a body region of the second conductivity type on a surface of the drift region; and (f) a step of forming a source region of the first conductivity type on a surface of the body region. Here, the pair of trenches are formed between the pair of column regions in the first direction, bottoms of the pair of trenches reach a position deeper than the body region, each of the plurality of unit cells includes the semiconductor substrate, the drift region, the pair of trenches, the pair of column regions, the gate insulating film, the pair of gate electrodes, the body region, and the source region, the two unit cells adjacent in the first direction share one column region of the pair of column regions and are arranged to be symmetrical about the shared column region, and in the first direction, a distance between the two trenches, which are adjacent with the one column region interposed therebetween, of the trenches in the two adjacent unit cells is different from a distance between the pair of trenches in the one unit cell.

According to the embodiment described above, it is possible to suppress the degradation in the performance of semiconductor device and ensure the reliability of semiconductor device.

BRIEF DESCRIPTION OF THE DRAWINGS

FIG. 4 is a cross-sectional view showing a manufacturing process of the semiconductor device according to the first embodiment.

DETAILED DESCRIPTION

Figure 1:
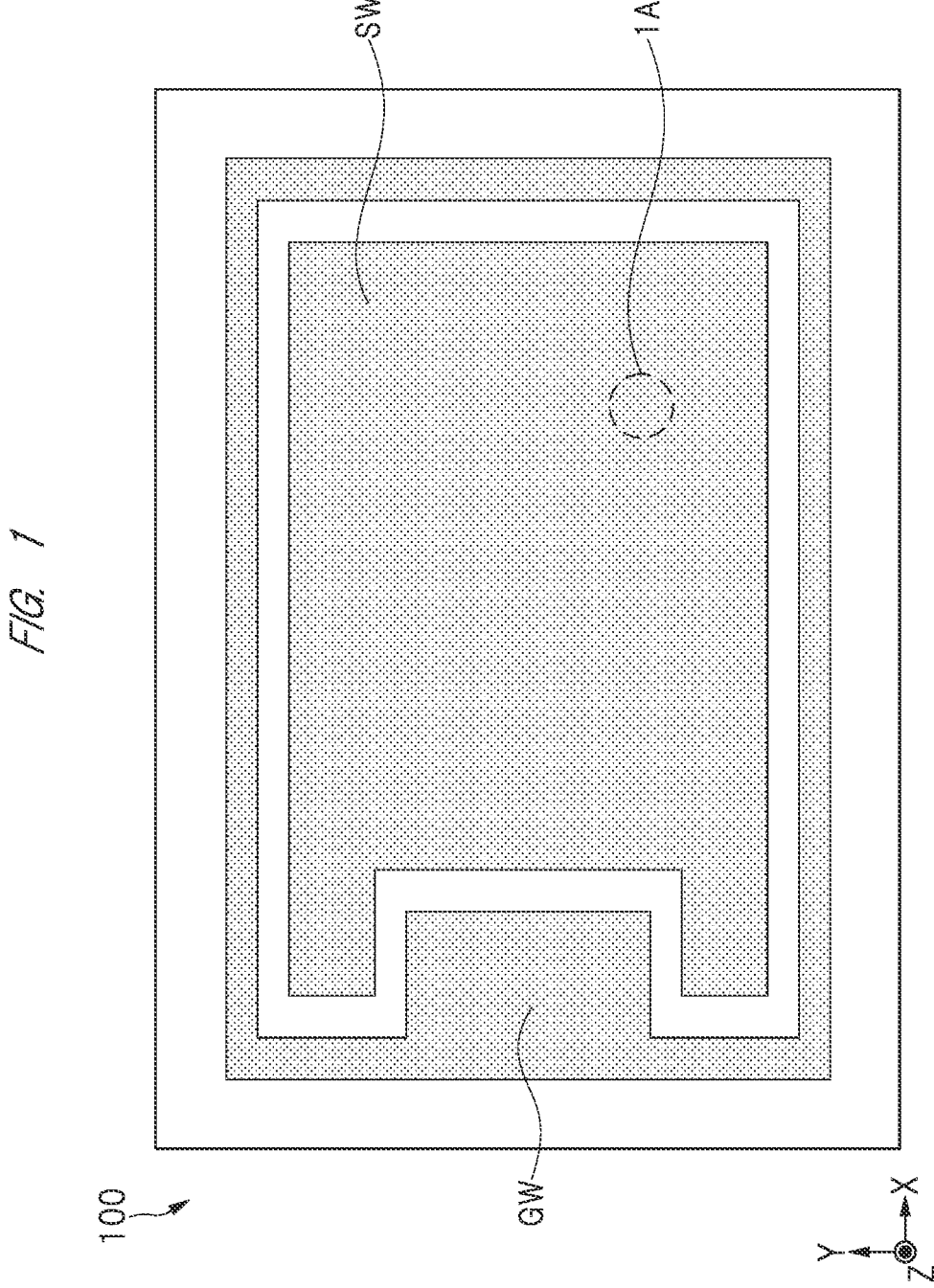
FIG. 1 is a plan view showing a semiconductor device according to the first embodiment.

Hereinafter, embodiments will be described in detail with reference to the drawings. Note that members having the same function are denoted by the same reference characters throughout the drawings for describing the embodiments, and the repetitive description thereof will be omitted. In addition, the description of the same or similar parts is not repeated in principle unless particularly required in the following embodiments.

Further, the X direction, the Y direction, and the Z direction in the description of this application intersect with each other, specifically, orthogonally intersect with each other. In this application, the Z direction is described as a vertical direction, a height direction, or a thickness direction of a certain structure. Also, the expression "in plan view" used in this application means that a plane constituted by the X direction and the Y direction is viewed in the Z direction.

First Embodiment

FIG. 1 is a plan view of a semiconductor chip corresponding to a semiconductor device 100. As shown in FIG. 1, most of the semiconductor device 100 is covered with a source wiring SW and a gate wiring OW is formed around the source wiring SW. Though not shown here, the source wiring SW and the gate wiring GW are covered with a protection film PIQ. Openings are formed in some parts of the protection film PIQ, and the source wiring SW and the gate wiring GW exposed through the openings serve as source pads and gate pads. By connecting external connection terminals such as wire bonding or clip (copper plate) on the source pad and the gate pad, the semiconductor device 100 is electrically connected to another chip or a wiring board. Note that a cell region 1A shown in FIG. 1 is a region in which main transistors such as power MOSFETs are formed.

<Matters Studied by Inventors of this Application>

Figure 14:
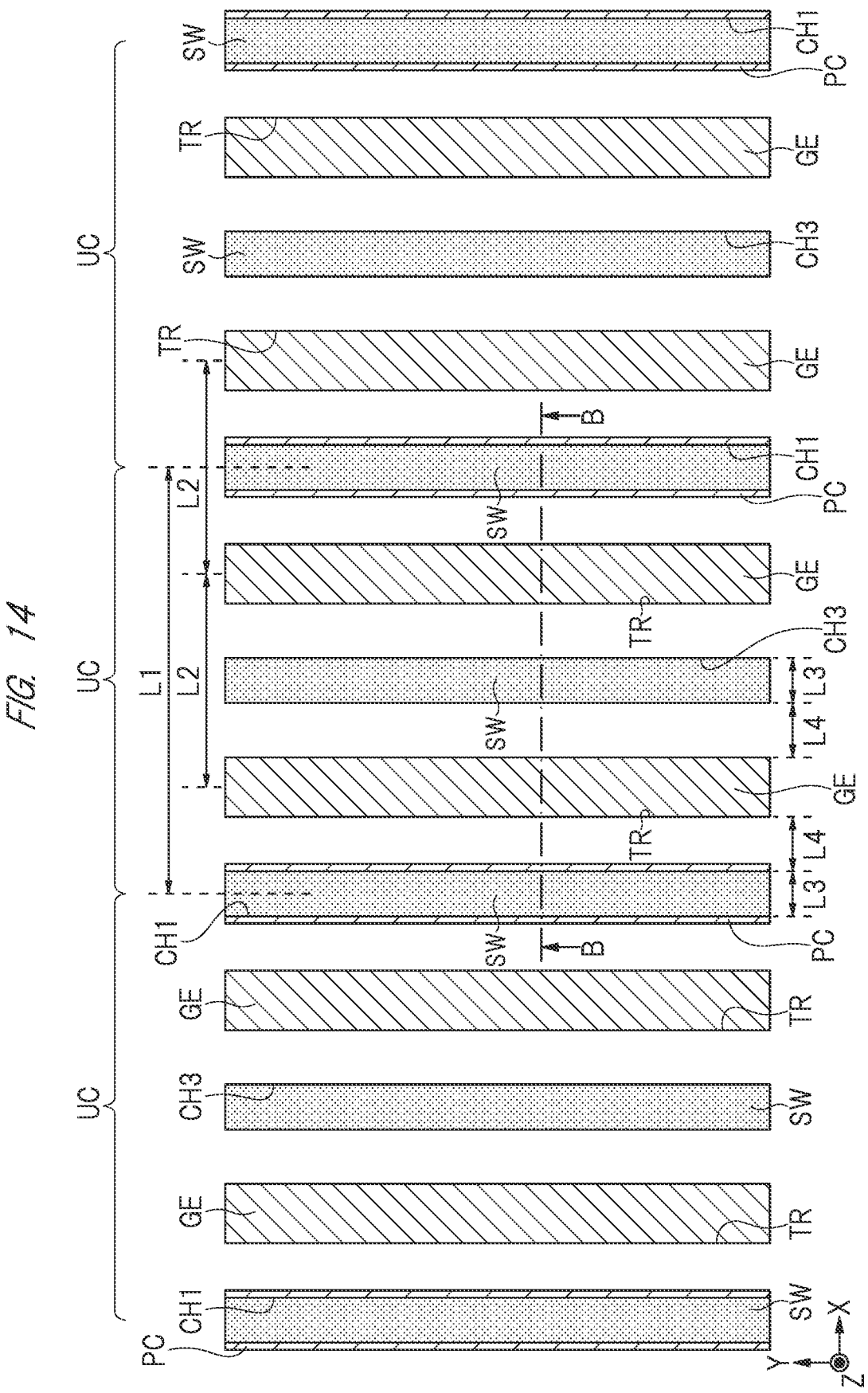
FIG. 14 is a plan view showing the principal part of a semiconductor device according to a studied example.

A semiconductor device of a studied example on which the inventors of this application has conducted a study and the problems thereof will be described below with reference to FIG. 14 and FIG. 15. FIG. 14 is an enlarged plan view of the principal part showing the cell region 1A in FIG. 1, and FIG. 15 is a cross-sectional view taken along the line B-B shown in FIG. 14.

As shown in FIG. 14, the semiconductor device of the studied example includes a plurality of unit cells UC in the cell region 1A. Also, each unit cell UC has a multi-trench SJ structure including a pair of trenches TR and a pair of gate electrodes GE.

Figure 15:
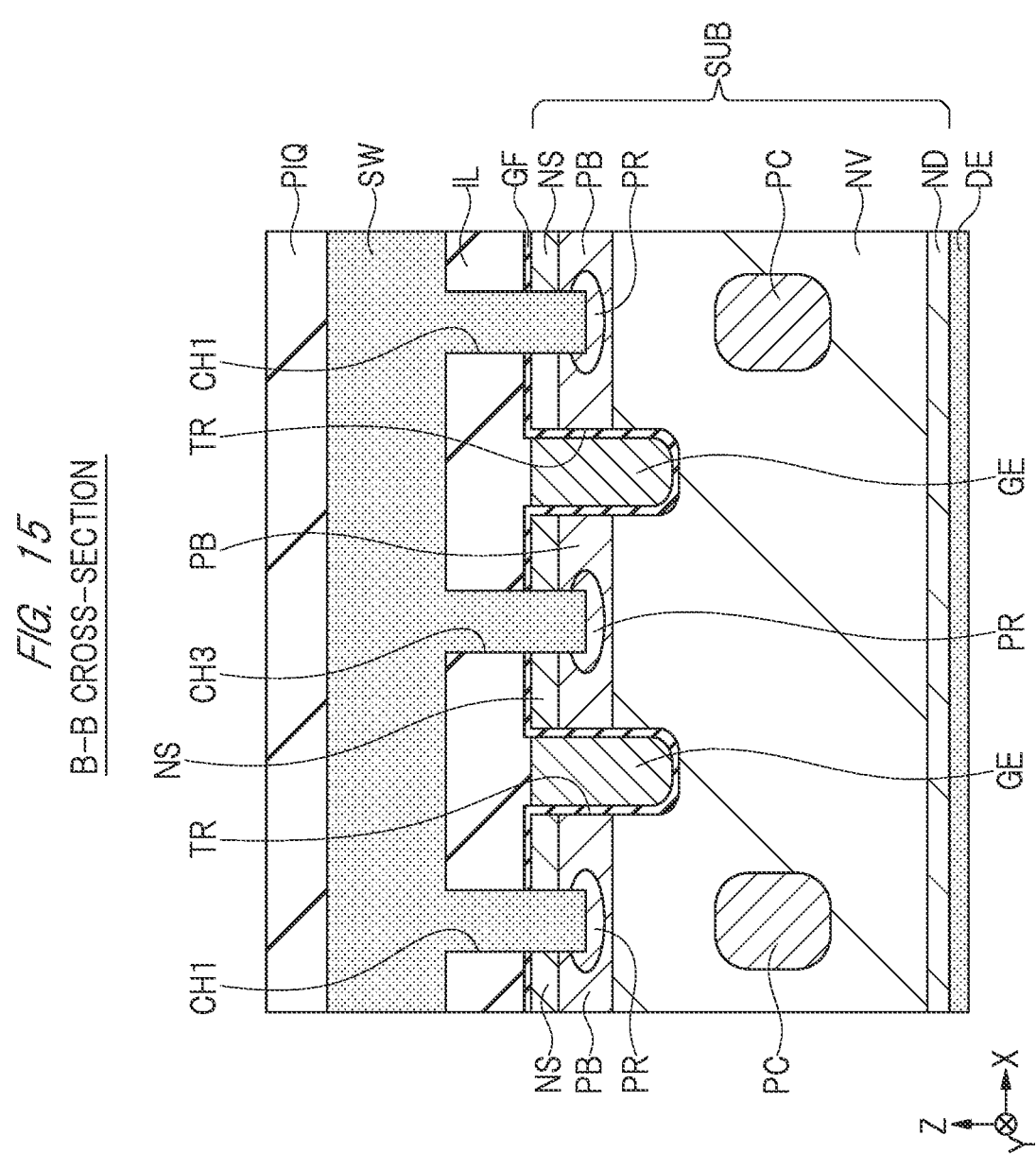
FIG. 15 is a cross-sectional view showing the semiconductor device according to the studied example.

As shown in FIG. 15, the unit cell UC includes a semiconductor substrate SUB having an n-type drift region NV, a p-type body region PB formed on a surface of the drift region NV, an n-type source region formed on a surface of the body region PB, a pair of p-type column regions PC formed in the drift region NV so as to be located below the body region PB, a pair of trenches TR formed in the drift region NV, and a pair of gate electrodes GE formed in the pair of trenches TR via a gate insulating film GF, respectively. In addition, an n-type drain region ND and a drain electrode DE are formed on a back surface of the semiconductor substrate SUB.

Further, in the unit cell UC, an interlayer insulating film IL is formed on the semiconductor substrate SUB, and a pair of holes CH1 and a hole CH3 are formed in the interlayer insulating film IL. A source wiring SW is formed on the interlayer insulating film IL so as to fill the pair of holes CH1 and the hole CH3. In addition, at the bottom of each of the pair of holes CH1 and the hole CH3, a high concentration region PR having an impurity concentration higher than that of the body region PB is formed in the body region PB.

In such a multi-trench SJ structure, a plurality of p-type column regions PC is formed at the boundaries of each unit cell UC at the same pitch (distance L1) in the X direction. In addition, the pitch of each of the trenches adjacent in the X direction is the same distance L2. Further, in the X direction, the width of the hole CH1 and the width of the hole CH3 are the same width L3.

The distance between the trench TR and the hole CH1 is the same as the distance between the trench TR and the hole CH3, and is the distance L4. However, the distance L4 is a numerical value at the time of design, and positions of the hole CH1 and the hole CH3 may shift in the X direction due to misalignment of the masks when forming the holes CH1 and CH3. In consideration of such a case, the distance L4 in this application can also be defined as follows. That is, the distance L4 is an average value of the distance between one of the pair of trenches TR and the hole CH3 and the distance between the other of the pair of trenches TR and hole CH3 in one unit cell UC. Further, the distance L4 is an average value of the distance between the trench TR and the hole CH1 of one unit cell UC and the distance between the trench TR and the hole CH1 of the other unit cell UC, in the two unit cells adjacent in the X direction.

In order to reduce the normalized on-resistance (Rsp), as in the above-mentioned Patent Document 1, the column region PC is not provided between the pair of trenches TR.

Here, according to the study by the inventors of this application, it has been found that if each dimension is simply reduced in order to promote miniaturization of semiconductor devices, the high concentration region PR comes closer to the trench TR, which causes the problem of the increase in the threshold voltage. Further, it has also been found that the ion implantation for forming the column region PC may cause damage near the corner of the trench TR (the region where the gate insulating film GF is formed). Namely, it has been found that there is a possibility that the performance of semiconductor devices will be degraded and the reliability of semiconductor devices will be lowered when the miniaturization is promoted.

<Structure of Semiconductor Device in First Embodiment>

Figure 2:
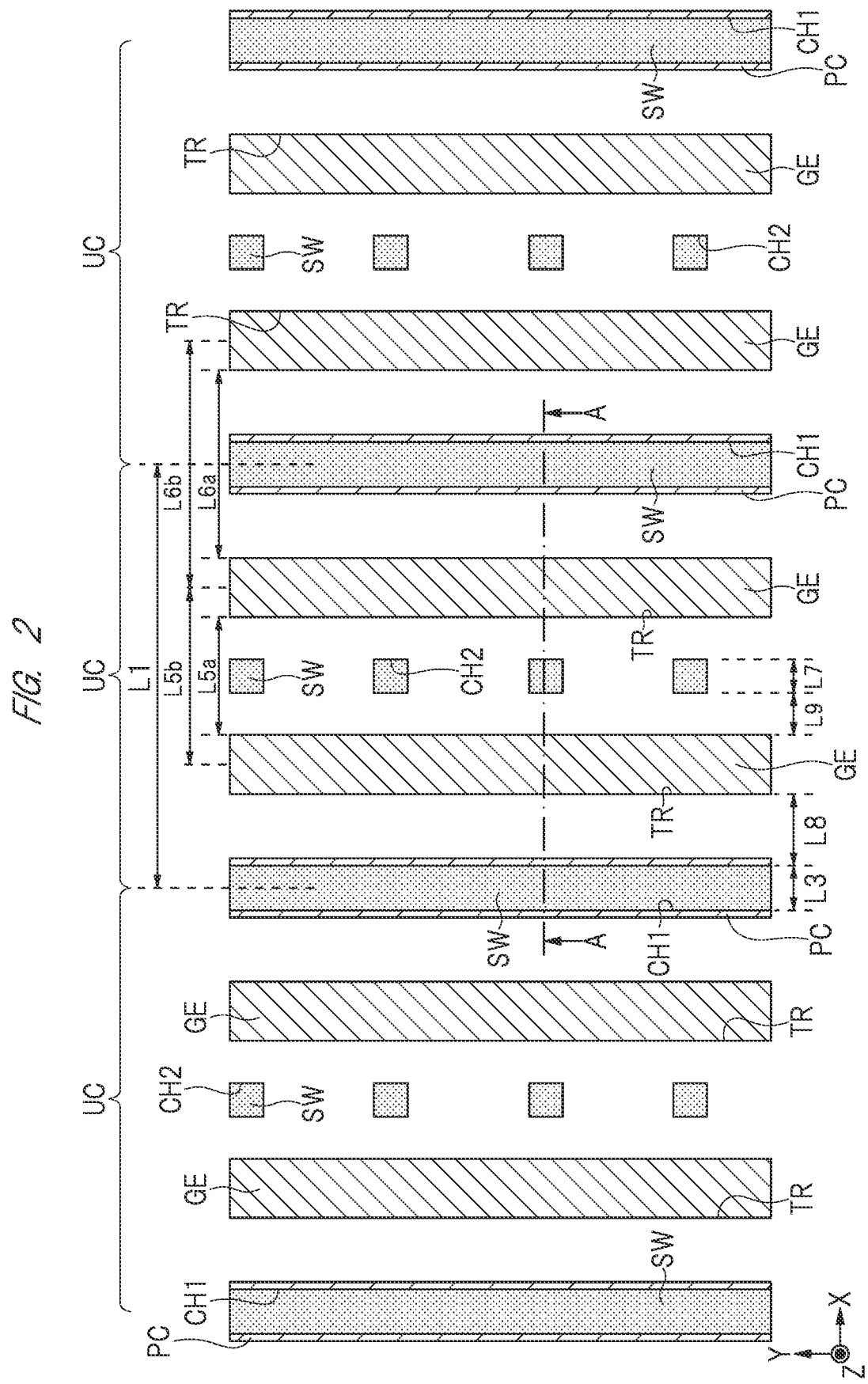
FIG. 2 is a plan view showing the principal part of the semiconductor device according to the first embodiment.

The inventors of this application have devised the semiconductor device 100 according to the first embodiment in consideration of the problems in the above-mentioned studied example. The semiconductor device 100 according to the first embodiment will be described below with reference to FIG. 2 and FIG. 3. FIG. 2 is an enlarged plan view of the principal part showing the cell region 1A in FIG. 1, and FIG. 3 is a cross-sectional view taken along the line A-A shown in FIG. 2.

As shown in FIG. 2, the semiconductor device 100 according to the first embodiment includes a plurality of unit cells UC in the cell region 1A as in the studied example, and each unit cell UC forms a multi-trench SJ structure.

Figure 3:
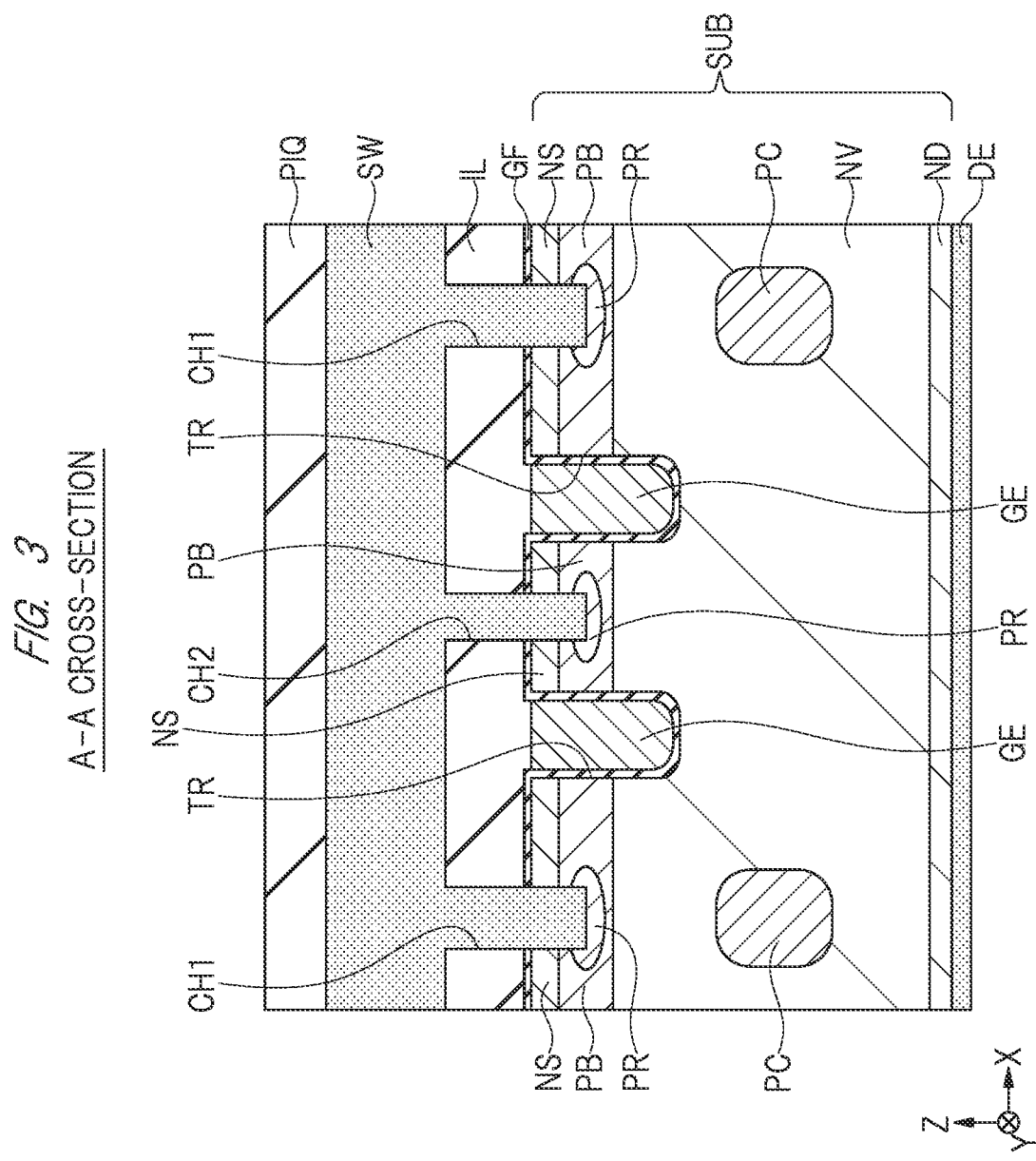
FIG. 3 is a cross-sectional view showing the semiconductor device according to the first embodiment.

FIG. 3 shows a cross-sectional structure of one unit cell UC of the semiconductor device 100. The semiconductor substrate SUB is made of, for example, n-type silicon and includes a drift region NV made of an n-type semiconductor layer. On the surface of the drift region NV, a p-type body region is formed. An n-type source region NS is formed on the surface of the body region PB. The source region NS has an impurity concentration higher than that of the drift region NV.

In the drift region NV, a pair of column regions PC are formed so as to be located below the body region PB. The pair of column regions PC extend in the Y direction, are separately adjacent to each other in the X direction, and are physically separated from the body region PB in the Z direction. Note that the pair of column regions PC have an impurity concentration higher than that of the body region PB.

In the drift region NV, a pair of trenches TR are formed such that bottoms thereof reach a position deeper than the body region PB. The pair of trenches TR extend in the Y direction and are formed between the pair of column regions PC in the X direction. A pair of gate electrodes GE are formed in the pair of trenches TR via a gate insulating film GF, respectively. The gate insulating film GF is, for example, a silicon oxide film, and the gate electrode GE is, for example, an n-type polycrystalline silicon film.

On the back surface of the semiconductor substrate SUB, an n-type drain region ND and a drain electrode DE are formed. The n-type drain region ND has an impurity concentration higher than that of the drift region NV. The drain electrode DE is composed of a single layer of metal film such as an aluminum film, a titanium film, a nickel film, a gold film, or a silver film, or a stacked film made by stacking these metal films as appropriate.

On the semiconductor substrate SUB, an interlayer insulating film IL is formed so as to cover the pair of gate electrodes GE. A pair of holes CH1 and a hole CH2 are formed in the interlayer insulating film IL. The pair of holes CH1 and the hole CH2 penetrate the interlayer insulating film IL and the source region NS such that bottoms thereof are located in the body region PB. The pair of holes CH1 are provided at positions overlapping the pair of column regions PC in plan view and extend in the Y direction. The hole CH2 is formed between the pair of gate electrodes GE in the X direction, and a plurality of the holes CH2 is formed in the interlayer insulating film IL so as to be separately adjacent to each other in the Y direction. In addition, in the body region PB, a high concentration region PR having an impurity concentration higher than that of the body region PB is formed at the bottom of each of the pair of holes CH1 and the hole CH2.

On the interlayer insulating film IL, the source wiring SW is formed so as to fill the pair of holes CH1 and the hole CH2. The source wiring SW is electrically connected to the source region NS, the body region PB, and the high concentration region PR, and supplies source potential to them. On the source wiring SW, for example, a protection film PIQ such as a polyimide film is formed. Although not shown here, a gate wiring GW electrically connected to the gate electrode GE is also formed on the interlayer insulating film IL. Also, the source wiring SW and the gate wiring GW are composed of, for example, a barrier metal film such as a titanium nitride film and a main conductive film such as an aluminum film.

The semiconductor device 100 can be applied to, for example, a high-side MOSFET and a low-side MOSFET included in a DC/DC converter. Also, when the DC/DC converter is used as a motor drive circuit, the low-side MOSFET is sometimes used as a diode by short-circuiting the gate electrode GE to the source wiring SW. Here, due to the electromotive force generated from a motor (inductance), a voltage Vds is applied between the source and the drain of the MOSFET for diode mentioned above, so that the output capacitance changes and the reverse recovery current is generated. If the output capacitance is highly dependent on the voltage Vds, the reverse recovery current is generated rapidly, and this appears as noise. In order to reduce this noise, a method of mounting a snubber circuit (MIM capacitor) may be conceivable, but the high-speed operation of the MOSFET is limited if the snubber circuit is provided.

Here, the column region PC in the first embodiment is physically separated from the body region PB. Therefore, no source potential is applied to the pair of column regions PC, and the pair of column regions PC have a floating structure. In the case of the floating structure, the depletion layers generated from the column region PC and the body region PB are separated during the thermal equilibrium state (voltage Vds=0 V). Therefore, the abrupt change in the output capacitance during positive bias (voltage Vds>0 V) can be suppressed as compared with the case where the column region PC is physically connected to the body region PB. As a result, noise can be reduced without providing a snubber circuit.

<Main Features of First Embodiment>

The main features of the first embodiment (FIG. 2 and FIG. 3) will be described below, while comparing with the studied example (FIG. 14 and FIG. 15) mentioned above.

Also in the first embodiment, the plurality of p-type column regions PC is formed at the boundaries of each unit cell UC at the same pitch (distance L1) in the X direction as in the studied example. Namely, the two unit cells UC adjacent in the X direction share one column region of the pair of column regions PC and are arranged to be symmetrical about the shared column region PC.

In the studied example, the pitch of each of the trenches TR adjacent in the X direction is the same distance L2. On the other hand, in the first embodiment, the pitch of a pair of trenches TR in one unit cell UC (distance L5b) is different from the pitch of the trenches TR in the different unit cells UC (distance L6b) and is smaller than the distance L6b. Namely, the distance L5a between a pair of trenches TR in one unit cell UC is different from the distance L6a between the trenches TR in different unit cells UC. In other words, with respect to each trench of the two unit cells UC adjacent in the X direction, the distance L6a between the two trenches TR adjacent with one column region PC interposed therebetween is different from the distance L5a between a pair of trenches TR in one unit cell UC, and is larger than L5a.

The studied example has the problem that the ion implantation for the column region PC causes damage near the corner of the trench TR and the problem that the high concentration region PR comes closer to the trench TR, which causes the increase in the threshold voltage. On the other hand, in the first embodiment, each trench TR is apart from the column region PC and is apart also from the high concentration region PR located above the column region PC. Therefore, the above problems can be suppressed.

In other words, the above feature means that the distance L8 between the trench TR and the hole CH1 is made larger than the distance L4 in the studied example. Therefore, in the first embodiment, the distance L8 between the trench TR and the hole CH1 is larger than the distance L9 between the trench TR and the hole CH2 in the X direction. Namely, in the X direction, the distance L8 between one trench TR, which is located near one column region PC, of the pair of trenches TR and one hole CH1, which overlaps one column region PC in plan view, of the pair of holes CH1 is larger than the distance L9 between the one trench TR and the hole CH2.

As described below, the high concentration region PR is formed by forming the pair of holes CH1 and the hole CH2 and then performing ion implantation to the body region PB located at the bottom of these holes. Therefore, the reduction in the distance between the trench TR and the hole CH1 or the reduction in the distance between the trench TR and the hole CH2 means that the high concentration region PR comes closer to the trench TR and the increase in threshold voltage is likely to occur.

By the way, by setting the distance L8 as described above, the distance L9 between one trench TR and the hole CH2 becomes smaller than the distance L4 in the studied example. Consequently, on the side with the hole CH2, the high concentration region PR comes closer to the trench TR, which may cause the increase in threshold voltage.

Therefore, in the first embodiment, the hole CH2 is not formed to have a striped shape like the hole CH1, but is formed to have dot-shaped pattern. Namely, the plurality of holes CH2 is formed such that they are separately adjacent to each other in the Y direction. By providing such a plurality of holes CH2, the area in which the high concentration region PR faces the trench TR can be reduced three-dimensionally on the side with the hole CH2. Therefore, the increase in threshold voltage can be suppressed even on the side with the hole CH2.

Furthermore, in the studied example, the widths of the pair of holes CH1 and the hole CH3 are the same width L3 in the X direction, but in the first embodiment, the width L7 of hole CH2 is smaller than the width L3 of each of the pair of holes CH1 in the X direction. Specifically, the width of the hole CH2 is the minimum processing dimension for manufacturing semiconductor device 100. Therefore, the trench TR can be made as apart as possible from the high concentration region PR, and thus the increase in threshold voltage can be further suppressed.

On the other hand, the hole CH1 is formed to have a striped shape as in the studied example, and the width of the hole CH1 is the width L3.

In the semiconductor device 100, an operation of forcibly turning off (UIS operation) is performed when a large current is flowing, and avalanche breakdown occurs and electron-hole pairs are generated at that time. Here, electrons are discharged to the side with the drain electrode DE, while it is necessary to efficiently discharge holes to the side with the source wiring SW via the holes CH1 and CH2. Since the avalanche breakdown occurs mainly in the vicinity of the column region PC, it is efficient to provide a hole discharge path on the side with the hole CH1 rather than the side with the hole CH2. Therefore, the holes can be efficiently discharged by making the hole CH1 have a striped shape extending in the Y direction and making the hole CH1 have the width L3 larger than the width L7 of hole CH2.

As described above, in the first embodiment, even when the pitch (distance L1) of each unit cell UC is the same as that in the studied example, the various problems that have occurred in the studied example can be suppressed. Therefore, the performance of the semiconductor device 100 can be improved and the reliability of the semiconductor device 100 can be improved. In addition, since the problems in the studied example become more noticeable as the miniaturization is promoted, the technology disclosed in the first embodiment is effective also for promoting the miniaturization.

<Method of Manufacturing Semiconductor Device>

A method of manufacturing the semiconductor device 100 according to the first embodiment will be described below with reference to FIG. 4 to FIG. 11. FIG. 4 to FIG. 11 are cross-sectional views taken along the line A-A in FIG. 2 similarly to FIG. 3, and show the process of manufacturing one unit cell UC.

Figure 4:
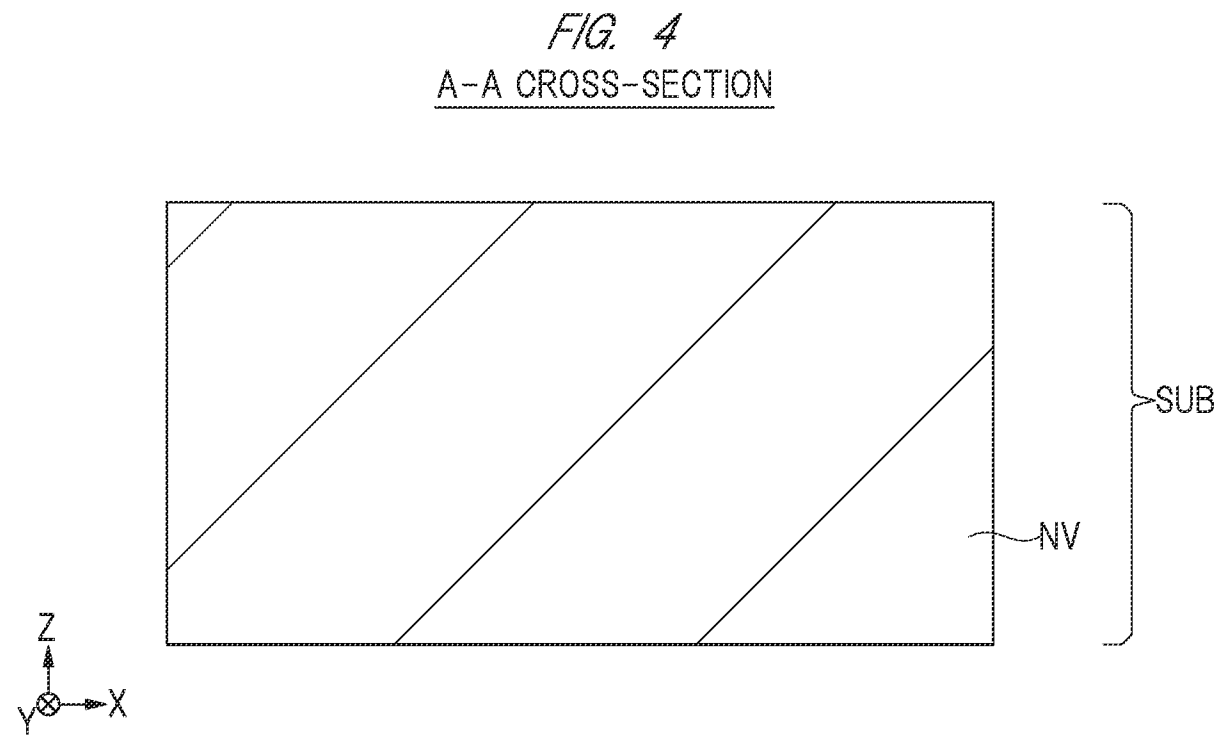

First, as shown in FIG. 4, the semiconductor substrate SUB having the drift region NV made of an n-type semiconductor layer is prepared. For example, the drift region NV is formed by growing a silicon layer while introducing phosphorus (P) by the epitaxial growth method on an n-type silicon substrate.

Figure 5:
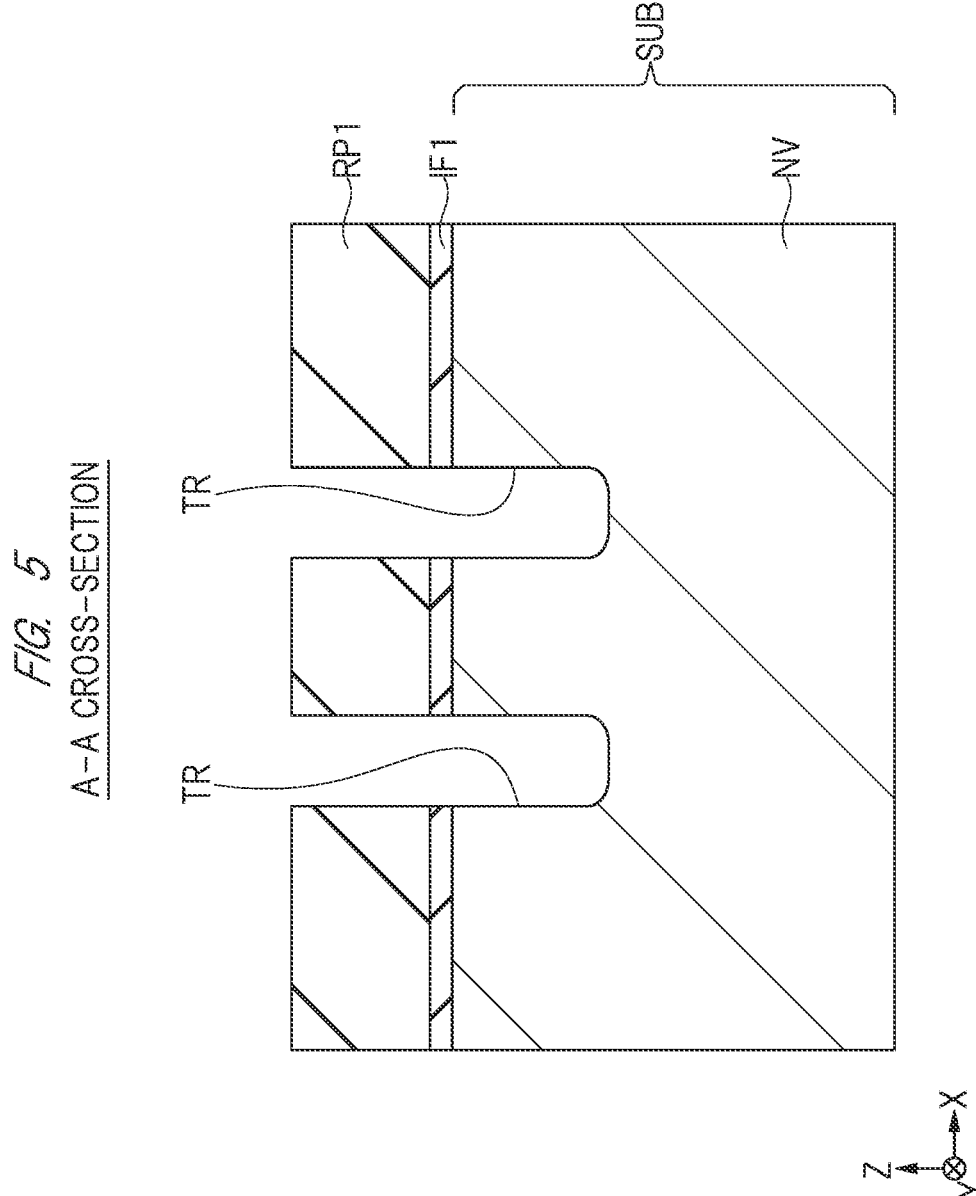
FIG. 5 is a cross-sectional view showing the manufacturing process subsequent to FIG. 4.

As shown in FIG. 5, a pair of trenches TR are formed in the drift region NV. First, an insulating film IF1 made of, for example, a silicon oxide film is formed on the semiconductor substrate SUB by the CVD method or the like. Next, a resist pattern RP1 having openings is formed on the insulating film IF1 by the photolithography method. Next, by performing the dry etching process using the resist pattern RP1 as a mask to the insulating film IF1 and the drift region NV exposed through the openings mentioned above, the pair of trenches TR are formed in the drift region NV. Then, the resist pattern RP1 is removed by the ashing process, and the insulating film IF1 is removed by the wet etching process using, for example, hydrofluoric acid.

Figure 6:
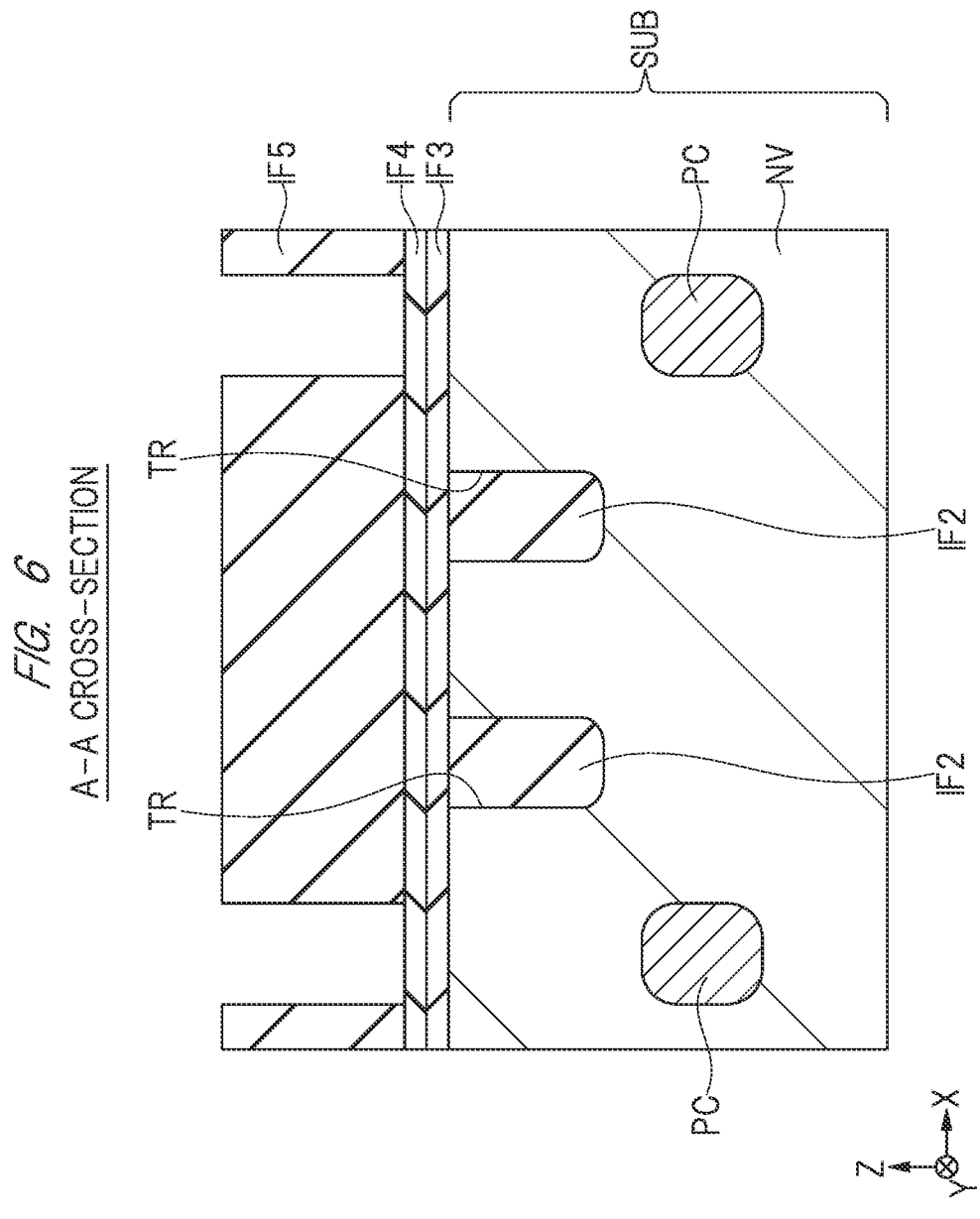
FIG. 6 is a cross-sectional view showing the manufacturing process subsequent to FIG. 5.

As shown in FIG. 6, a pair of p-type column regions PC are formed in the drift region NV. First, an insulating film IF2 made of, for example, a silicon oxide film is formed on the semiconductor substrate SUB so as to fill the pair of trenches TR by the CVD method or the like. Next, the insulating film IF2 located outside the pair of trenches TR is removed by, for example, the CMP method or the dry etching process.

Next, an insulating film IF3, an insulating film IF4, and an insulating film IF5 are sequentially formed on the semiconductor substrate SUB by, for example, the CVD method. The insulating films IF3 and IF5 are, for example, silicon oxide films, and the insulating film IF4 is, for example, a silicon nitride film. Note that the thickness of insulating film IF5 is adjusted to be larger than those of the insulating film IF3 and the insulating film IF4 such that the ion implantation in the next step does not reach the semiconductor substrate SUB.

Next, by selectively patterning the insulating film IF5 by the photolithography method and the dry etching process, openings reaching the insulating film IF4 are formed in the insulating film IF5. Next, for example, boron (B) or the like is ion-implanted using the insulating film IF5 as a mask and the insulating film IF3 and the insulating film IF4 as a protection film to protect the surface of the semiconductor substrate SUB. As a result, the pair of p-type column regions PC located below the openings of the insulating film IF5 are formed in the drift region NV.

Figure 7:
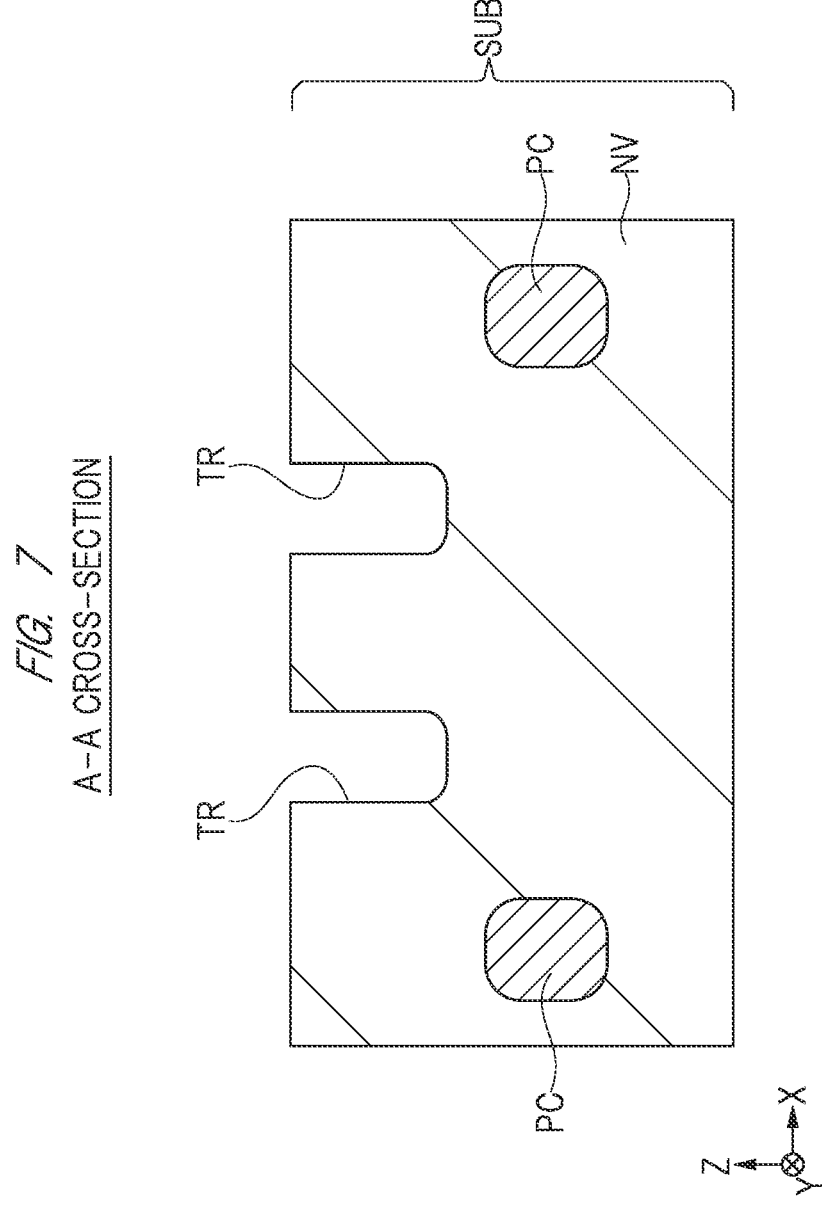
FIG. 7 is a cross-sectional view showing the manufacturing process subsequent to FIG. 6.

As shown in FIG. 7, the insulating film IF5, the insulating film IF4, the insulating film IF3, and the insulating film IF2 are sequentially removed by the wet etching process. First, the insulating film IF5 is removed by the wet etching process using, for example, hydrofluoric acid. Next, the insulating film IF4 is removed by the wet etching process using, for example, phosphoric acid. Next, the insulating film IF3 and the insulating film IF2 are removed by the wet etching process using, for example, hydrofluoric acid. As a result, the surface of the semiconductor substrate SUB including the inside of the trenches TR is exposed.

Figure 8:
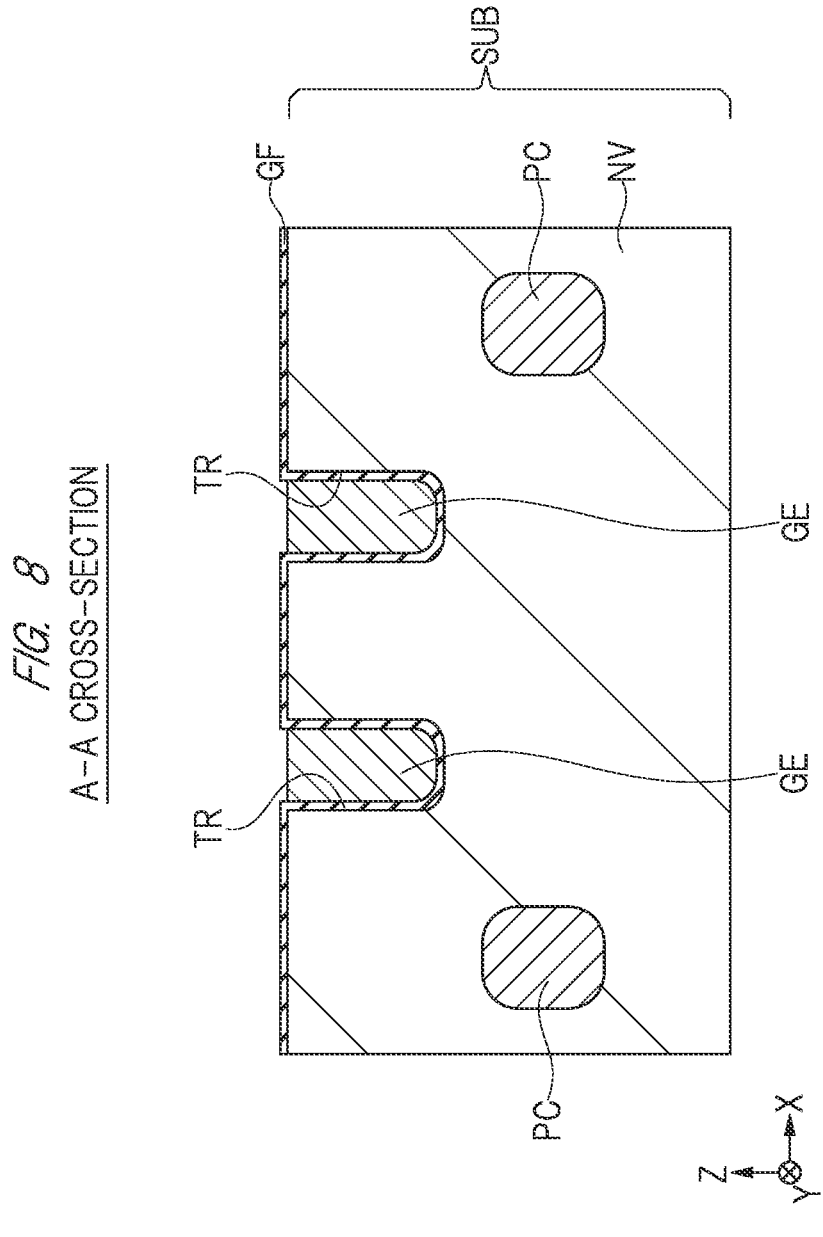
FIG. 8 is a cross-sectional view showing the manufacturing process subsequent to FIG. 7.

As shown in FIG. 8, a pair of gate electrodes GE are formed in the pair of trenches TR via the gate insulating film GF, respectively. First, the gate insulating film GF made of a silicon oxide film is formed on the semiconductor substrate SUB including the inside of the pair of trenches TR by, for example, the thermal oxidation method. Next, a polycrystalline silicon film in which an n-type impurity is introduced is formed on the semiconductor substrate SUB by, for example, the CVD method so as to fill the inside of the pair of trenches TR via the gate insulating film GF. Next, the polycrystalline silicon film located outside the pair of trenches TR is removed by, for example, the CMP method or the dry etching process.

Figure 9:
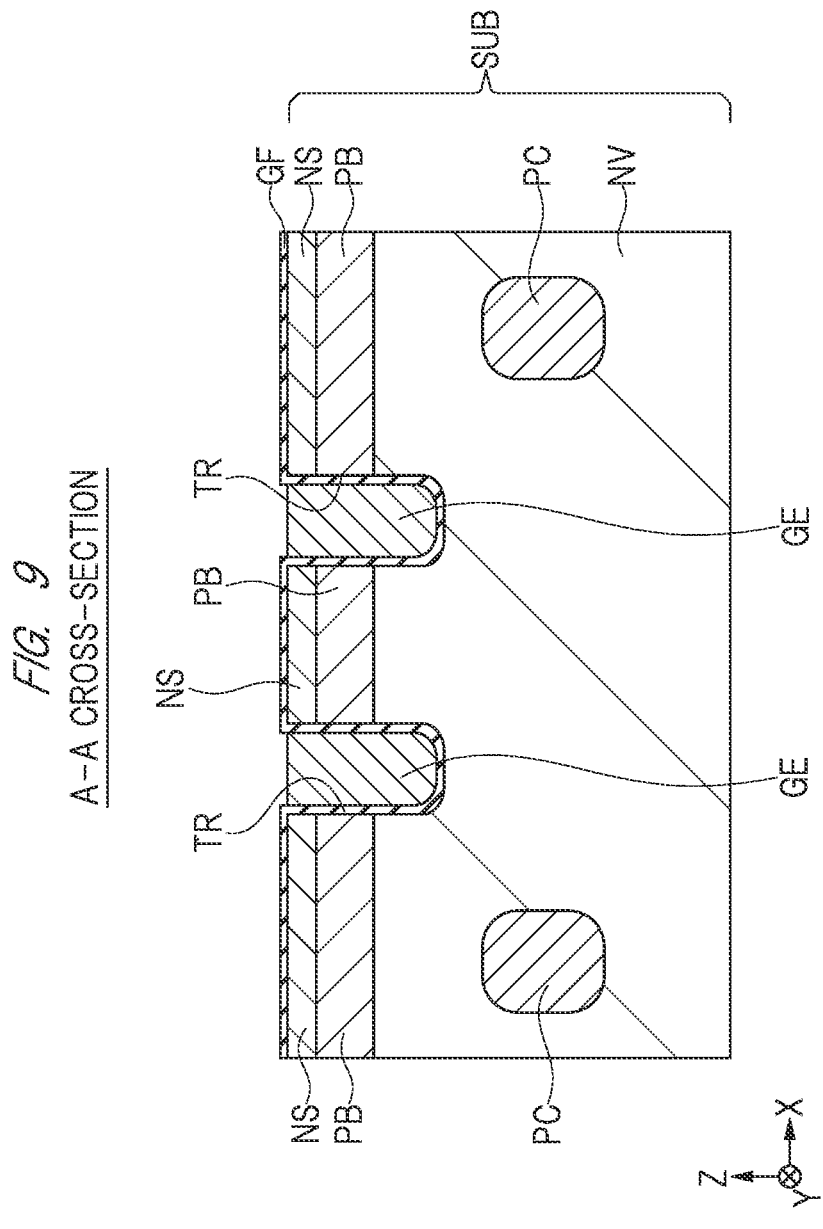
FIG. 9 is a cross-sectional view showing the manufacturing process subsequent to FIG. 8.

As shown in FIG. 9, the p-type body region PB is formed on the surface of the drift region NV, and the n-type source region NS is formed on the surface of the body region PB. First, the p-type body region PB is formed by introducing boron (B) or the like into the surface of the drift region NV by the photolithography method and the ion implantation method. Next, the n-type source region NS is formed by introducing arsenic (As) or the like into the surface of body region PB by the photolithography method and the ion implantation method.

Figure 10:
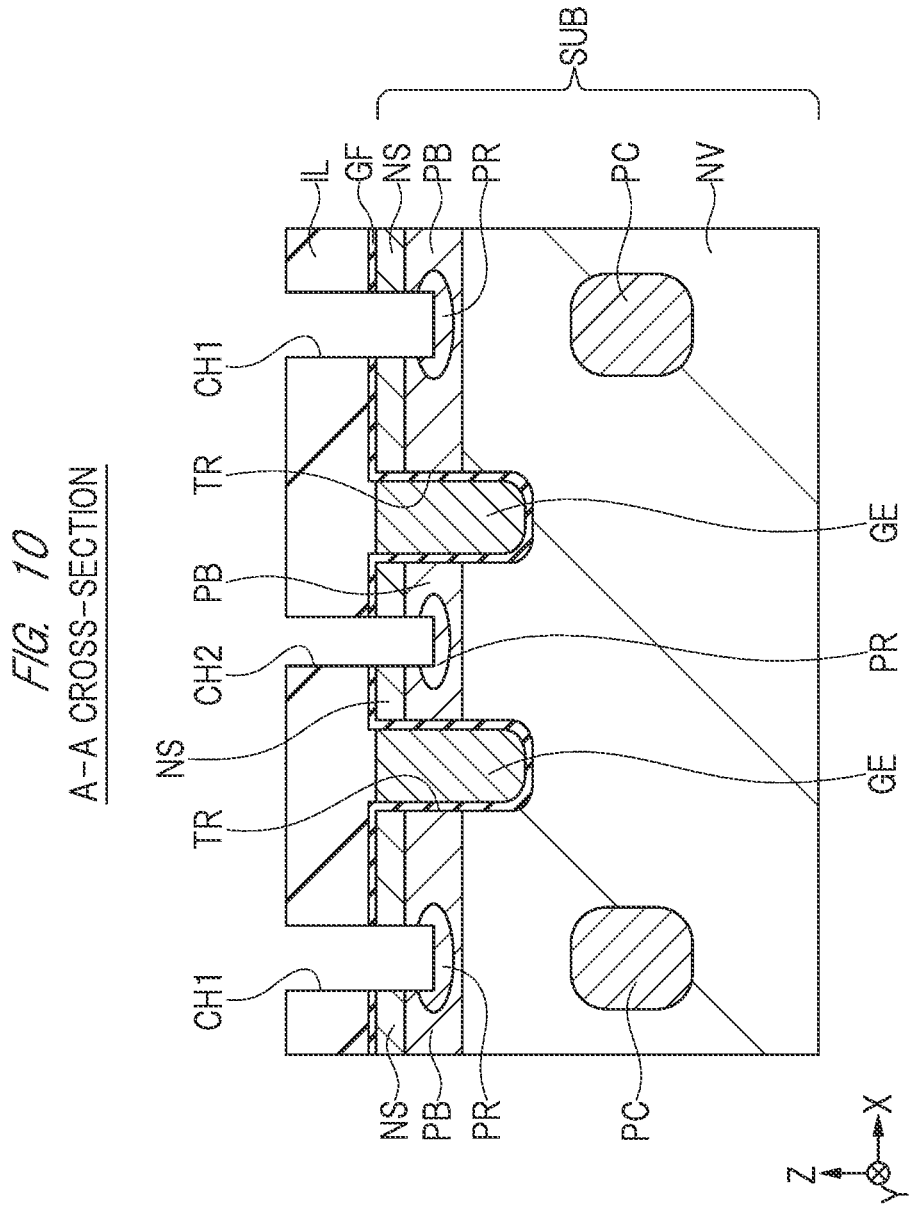
FIG. 10 is a cross-sectional view showing the manufacturing process subsequent to FIG. 9.

As shown in FIG. 10, the interlayer insulating film IL is formed on the semiconductor substrate SUB, the pair of holes CH1 and the hole CH2 are formed in the interlayer insulating film IL, and the high concentration regions PR are formed in the body region PB. First, on the semiconductor substrate SUB, the interlayer insulating film IL made of, for example, a silicon oxide film is formed by, for example, the CVD method so as to cover the pair of gate electrodes GE. Next, the pair of holes CH1 and the hole CH2 penetrating the interlayer insulating film IL and the source region NS are formed by the photolithography method and the dry etching process. The bottom of each of the pair of holes CH1 and the hole CH2 is located in the body region PB. Next, at the bottom of each of the pair of holes CH1 and the hole CH2, boron (B) or the like is ion-implanted into the body region PB, thereby forming the p-type high concentration region PR having an impurity concentration higher than that of the body region PB.

Figure 11:
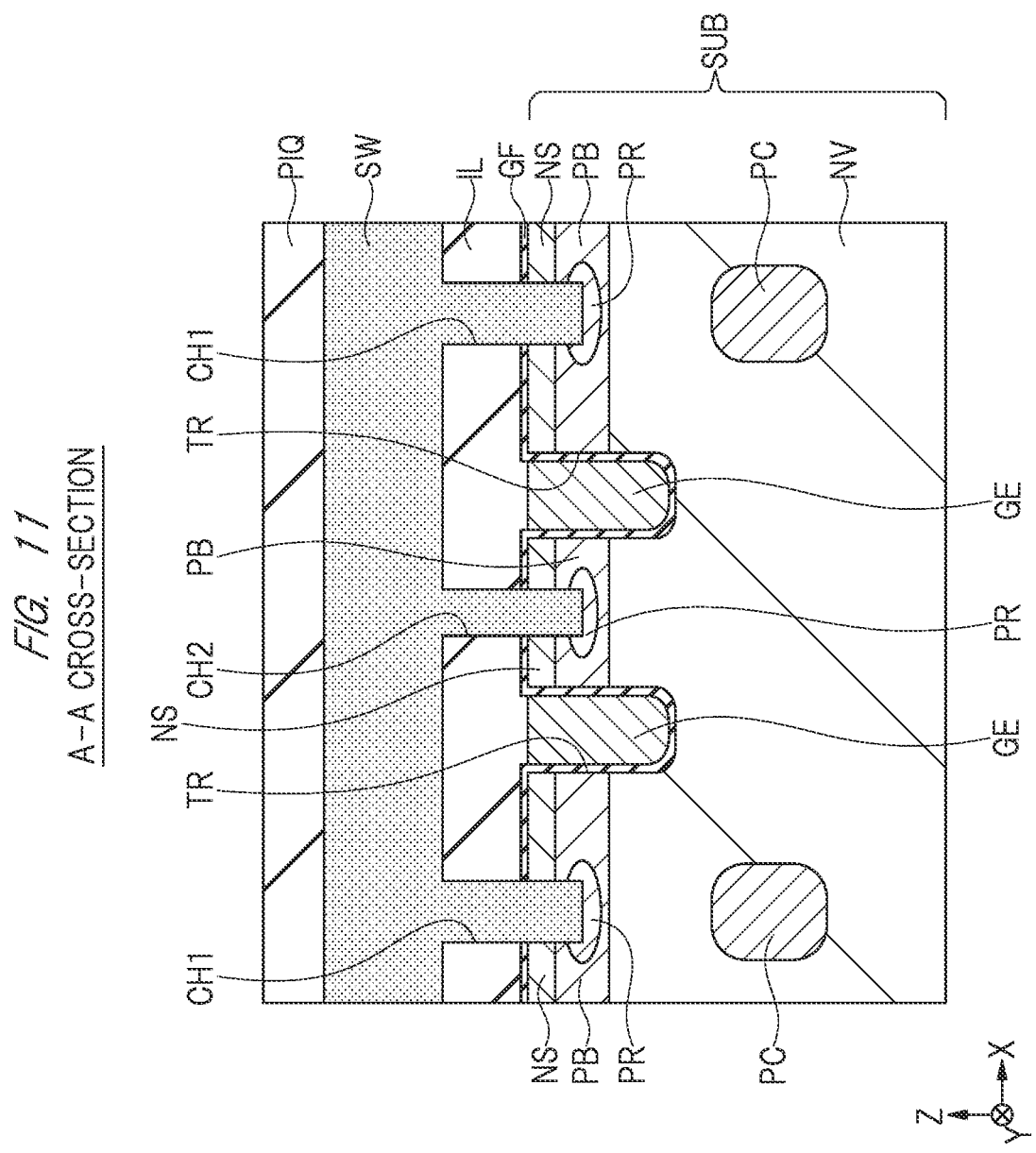
FIG. 11 is a cross-sectional view showing the manufacturing process subsequent to FIG. 10.

As shown in FIG. 11, the source wiring SW is formed on the interlayer insulating film IL, and the protection film PIQ is formed on the source wiring SW. First, the source wiring SW is formed on the interlayer insulating film IL by the sputtering method or the CVD method so as to fill the pair of holes CH1 and the hole CH2. Although not shown here, the gate wiring GW is also formed on the interlayer insulating film IL by the same process of forming the source wiring SW. Next, the protection film PIQ made of, for example, a polyimide film is formed on the source wiring SW and the gate wiring GW by, for example, the coating method. Thereafter, though not shown, openings are formed in a part of the protection film PIQ such that regions to be the source pad and the gate pad are exposed on the source wiring SW and the gate wiring GW.

After FIG. 11, first, the back surface of the semiconductor substrate SUB is polished if necessary. Next, the n-type drain region ND is formed on the back surface of the semiconductor substrate SUB by introducing, for example, arsenic (As) by the ion implantation method. Next, the drain electrode DE is formed on the drain region ND by the sputtering method.

Through the process described above, the semiconductor device 100 shown in FIG. 3 is manufactured.

Second Embodiment

The semiconductor device 100 according to the second embodiment will be described below with reference to FIG. 12 and FIG. 13. In the following, differences from the first embodiment will be mainly described, and the descriptions of the points overlapping the first embodiment will be omitted. FIG. 13 is a cross-sectional view taken along the line C-C shown in FIG. 12. Note that the cross-sectional view taken along the line A-A shown in FIG. 12 is the same as FIG. 3 in the first embodiment.

Figure 12:
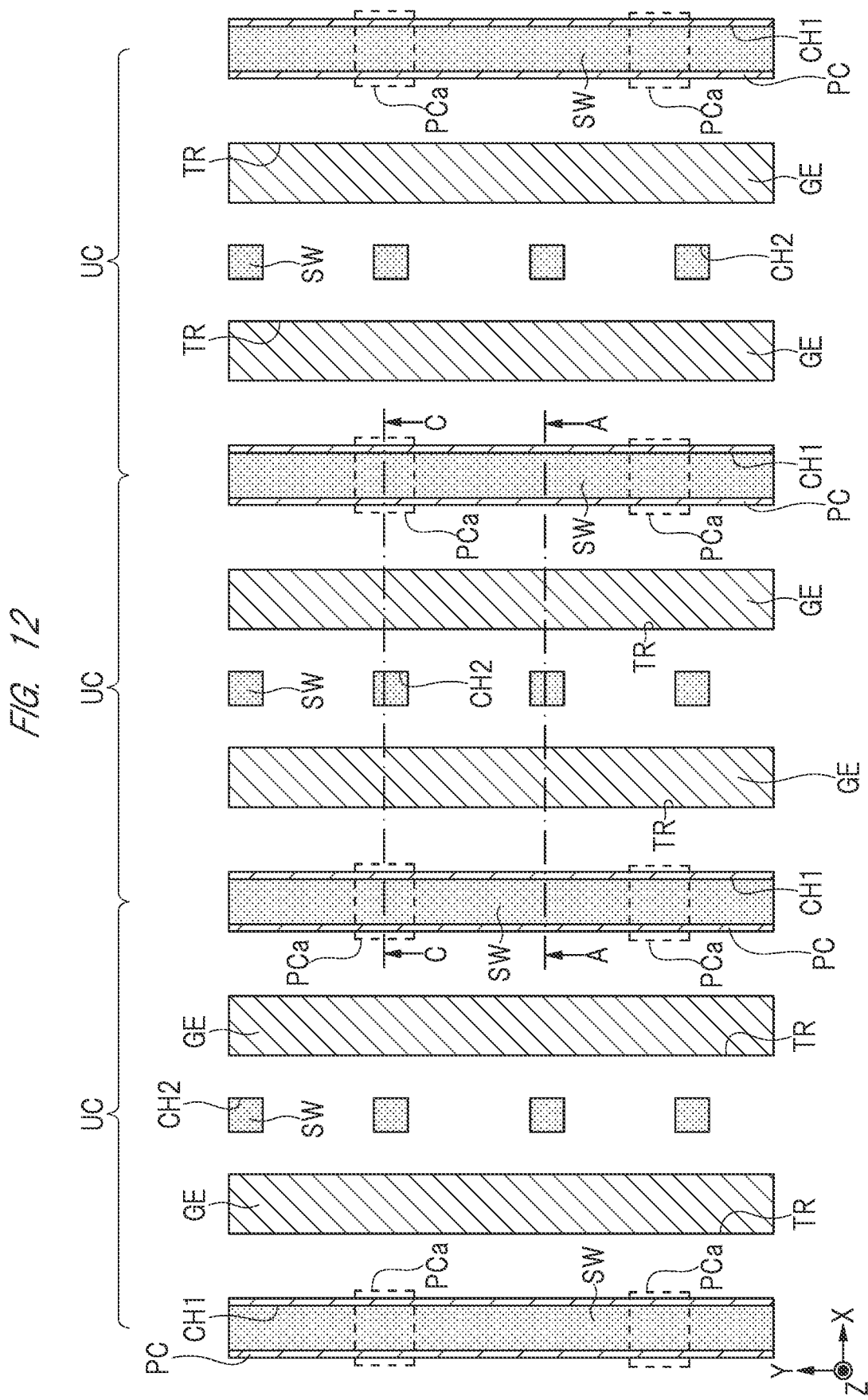
FIG. 12 is a plan view showing the principal part of a semiconductor device according to the second embodiment.
Figure 13:
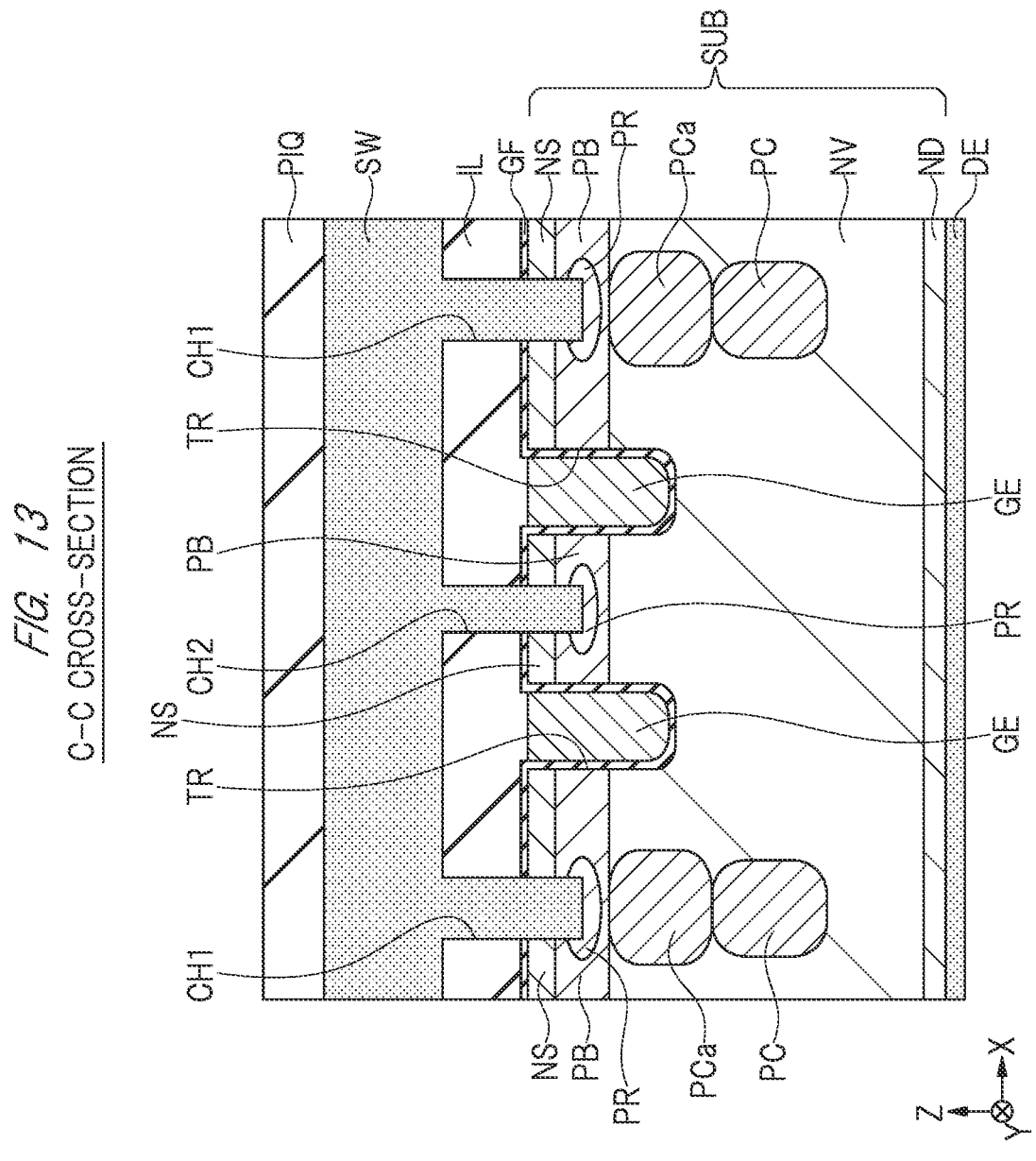
FIG. 13 is a cross-sectional view showing the semiconductor device according to the second embodiment.

As shown in FIG. 12 and FIG. 13, in the second embodiment, p-type connection regions PCa are formed in the drift region NV, and the p-type connection region PCa is provided in the middle of the column region PC extending in the Y direction. The p-type connection region PCa is provided at the position shallower than the column region PC and deeper than the body region PB. A part of the pair of column regions PC is connected to the body region PB by the connection region PCa. Note that the impurity concentration of the connection region PCa is equivalent to that of the column region PC, and is higher than that of the body region PB.

As mentioned above, since the avalanche breakdown occurs mainly in the vicinity of the column region PC, it is efficient to provide a hole discharge path on the side with the hole CH1. Here, the hole discharge efficiency can be increased at the place where the column region PC is connected to the body region PB. By providing such a place in a part of the column region PC by means of the connection region PCa, the hole discharge efficiency can be improved as compared with the case where the entire column region PC has the floating structure.

Note that the connection region PCa mentioned above can be formed as follows. First, from the state shown in FIG. 6, a resist pattern covering a part of the openings of the insulating film IF5 is formed. Next, for example, boron (B) or the like is ion-implanted using the resist pattern and the insulating film IF5 as a mask, thereby forming the connection region PCa in the drift region NV. Thereafter, the resist pattern is removed by the ashing process. Note that the connection region PCa may be formed after the column region PC, or the connection region PCa may be formed before the column region PC.

In the foregoing, the present invention has been specifically described based on the embodiments, but it goes without saying that the present invention is not limited to the embodiments described above and can be modified within the range not departing from the gist thereof.

What is claimed is:

1. A semiconductor device comprising a plurality of unit cells,
    wherein each of the plurality of unit cells includes:
        a semiconductor substrate having a drift region made of
            a semiconductor layer of a first conductivity type;
        a body region of a second conductivity type opposite to
            the first conductivity type formed on a surface of the
            drift region;

a source region of the first conductivity type formed on a surface of the body region;

a pair of column regions of the second conductivity type which are formed in the drift region so as to be located below the body region and are separately adjacent to each other in a first direction in plan view;

a pair of trenches formed in the drift region such that bottoms thereof reach a position deeper than the body region, and formed between the pair of column regions in the first direction; and a pair of gate electrodes formed in the pair of trenches via a gate insulating film, respectively, wherein the two unit cells adjacent in the first direction share one column region of the pair of column regions and are arranged to be symmetrical about the shared column region, wherein, in the first direction, a first distance between the two trenches, which are adjacent with the one column region interposed therebetween, of the trenches in the two adjacent unit cells is larger than a second distance between the pair of trenches in the one unit cell, wherein each of the plurality of unit cells further includes:

an interlayer insulating film formed on the semiconductor substrate so as to cover the pair of gate electrodes;

a pair of first holes penetrating the interlayer insulating film and the source region such that bottoms thereof are located in the body region, and provided at positions overlapping the pair of column regions in plan view;

a second hole penetrating the interlayer insulating film and the source region such that a bottom thereof is located in the body region, and formed between the pair of gate electrodes in the first direction; and a source wiring formed on the interlayer insulating film so as to fill the pair of first holes and the second hole, and wherein in the first direction, a third distance between one trench, which is located near the one column region, of the pair of trenches and one first hole, which overlaps the one column region in plan view, of the pair of first holes is larger than a fourth distance between the one trench and the second hole, wherein the pair of column regions, the pair of trenches, and the pair of first holes each extend in a second direction intersecting with the first direction in plan view, and wherein a plurality of the second holes is formed in the interlayer insulating film so as to be separately adjacent to each other in the second direction.

2. The semiconductor device according to claim 1, wherein in the first direction, a width of the second hole is smaller than that of each of the pair of first holes.

3. The semiconductor device according to claim 2, wherein at bottoms of the pair of first holes and the second hole, high concentration regions of the second conductivity type having an impurity concentration higher than that of the body region are formed in the body region.

4. The semiconductor device according to claim 1, wherein the pair of column regions are physically separated from the body region.

5. The semiconductor device according to claim 4, wherein a connection region of the second conductivity type is formed in the drift region, wherein the pair of column regions extend in a second direction intersecting with the first direction in plan view, and wherein a part of the pair of column regions is connected to the body region by the connection region.

6. A method of manufacturing a semiconductor device including a plurality of unit cells, the method comprising:

(a) preparing a semiconductor substrate having a drift region made of a semiconductor layer of a first conductivity type;

(b) forming a pair of trenches in the drift region;

(c) forming a pair of column regions of a second conductivity type opposite to the first conductivity type in the drift region so as to be separately adjacent to each other in a first direction in plan view;

(d) forming a pair of gate electrodes in the pair of trenches via a gate insulating film, respectively;

(e) forming a body region of the second conductivity type on a surface of the drift region;

(f) forming a source region of the first conductivity type on a surface of the body region;

(g) forming an interlayer insulating film on the semiconductor substrate so as to cover the pair of gate electrodes;

(h) forming a pair of first holes and a second hole penetrating the interlayer insulating film and the source region such that bottoms thereof are located in the body region; and (i) forming a source wiring on the interlayer insulating film so as to fill the pair of first holes and the second hole, wherein the pair of trenches are formed between the pair of column regions in the first direction, wherein bottoms of the pair of trenches reach a position deeper than the body region, wherein each of the plurality of unit cells includes the semiconductor substrate, the drift region, the pair of trenches, the pair of column regions, the gate insulating film, the pair of gate electrodes, the body region, and the source region, wherein the two unit cells adjacent in the first direction share one column region of the pair of column regions and are arranged to be symmetrical about the shared column region, wherein, in the first direction, a first distance between the two trenches, which are adjacent with the one column region interposed therebetween, of the trenches in the two adjacent unit cells is larger than a second distance between the pair of trenches in the one unit cell, wherein the pair of first holes are provided at positions overlapping the pair of column regions in plan view, wherein the second hole is formed between the pair of gate electrodes in the first direction, wherein each of the plurality of unit cells further includes the interlayer insulating film, the pair of first holes, the second hole, and the source wiring, wherein in the first direction, a third distance between one trench, which is located near the one column region, of the pair of trenches and one first hole, which overlaps the one column region in plan view, of the pair of first holes is larger than a fourth distance between the one trench and the second hole, wherein the pair of column regions, the pair of trenches, and the pair of first holes each extend in a second direction intersecting with the first direction in plan view, and wherein in (h), a plurality of the second holes is formed in the interlayer insulating film so as to be separately adjacent to each other in the second direction.

7. The method of manufacturing the semiconductor device according to claim 6, wherein in the first direction, a width of the second hole is smaller than that of each of the pair of first holes.

8. The method of manufacturing the semiconductor device according to claim 7 further comprising:

(j) between (h) and (i), a step of forming high concentration regions of the second conductivity type having an impurity concentration higher than that of the body region at bottoms of the pair of first holes and the second hole in the body region.

9. The method of manufacturing the semiconductor device according to claim 6, wherein the pair of column regions are physically separated from the body region.

10. The method of manufacturing the semiconductor device according to claim 9 further comprising:

(k) forming a connection region of the second conductivity type in the drift region, wherein the pair of column regions extend in a second direction intersecting with the first direction in plan view, and wherein a part of the pair of column regions is connected to the body region by the connection region.

* * * * *